United States Patent
Park

(10) Patent No.: US 6,498,044 B1
(45) Date of Patent: Dec. 24, 2002

(54) CAPACITOR HAVING PEROVSKITE SERIES DIELECTRIC FILM CONTAINING COPPER AND MANUFACTURING METHOD THEREOF

(75) Inventor: Won-mo Park, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/702,256

(22) Filed: Oct. 30, 2000

(30) Foreign Application Priority Data

Oct. 30, 1999 (KR) .............................. 99-47764

(51) Int. Cl.[7] .............................................. H01L 21/76
(52) U.S. Cl. ........................ 438/3; 438/239; 438/253; 438/396
(58) Field of Search ................................ 257/295, 303, 257/306, 310; 438/3, 239, 240, 253, 396

(56) References Cited

U.S. PATENT DOCUMENTS

| | | | |
|---|---|---|---|
| 5,036,424 A | | 7/1991 | Yokotani, et al. |
| 5,471,363 A | * | 11/1995 | Mihara ........................ 361/305 |
| 5,471,364 A | * | 11/1995 | Summerfelt et al. ........ 257/295 |
| 5,731,220 A | * | 3/1998 | Tsu et al. ....................... 438/3 |
| 5,838,035 A | * | 11/1998 | Ramesh ....................... 257/295 |
| 5,978,207 A | * | 11/1999 | Anderson et al. ............ 361/311 |
| 6,144,546 A | * | 11/2000 | Mizushima et al. ......... 361/303 |
| 6,274,388 B1 | * | 8/2001 | Aggarwal et al. .............. 438/3 |
| 6,297,200 B1 | * | 10/2001 | Simon et al. ................ 505/238 |

FOREIGN PATENT DOCUMENTS

KR 215861 5/1999

* cited by examiner

*Primary Examiner*—Tom Thomas
*Assistant Examiner*—Quang Vu
(74) *Attorney, Agent, or Firm*—Marger Johnson & McCollom, PC

(57) ABSTRACT

A capacitor having a perovskite series dielectric film, and manufacturing method thereof are provided. The perovskite series dielectric film capacitor is characterized in that the perovskite series dielectric film contains copper. The method of manufacturing the perovskite series dielectric film which contains copper includes forming the perovskite series dielectric film on a lower electrode, forming a $Cu_xO$ film on the perovskite series dielectric film, and permitting $Cu_xO$ or copper of the $Cu_xO$ film to penetrate the perovskite series dielectric film preferably by a heat treatment. In the perovskite series dielectric film capacitor, $Cu_xO$ or copper penetrates the grain boundary of the perovskite series dielectric film having a columnar crystal structure, thereby improving a leakage current characteristic of the perovskite series dielectric film.

10 Claims, 2 Drawing Sheets

CAPACITOR HAVING PEROVSKITE SERIES DIELECTRIC FILM CONTAINING COPPER AND MANUFACTURING METHOD THEREOF

BACKGROUND OF THE INVENTION

1. Field of the Invention

The present invention relates to a capacitor in a semiconductor device and a manufacturing method thereof, and more particularly, to a capacitor including a perovskite series dielectric film and a manufacturing method thereof.

2. Description of the Related Art

As integration of semiconductor devices progresses, the area occupied by capacitors is increasingly reduced. Thus, various approaches have been made to obtain high and stable capacitance in a relatively small area. These approaches include a method of using dielectric films in the metal oxide series such as tantalum oxide ($Ta_2O_5$), aluminum oxide ($Al_2O_3$), and titanium oxide ($TiO_2$), or dielectric films in the perovskite series such as BST((Ba, Sr) $TiO_3$), SBT(($SrBi_2Ta_2O_9$), and PZT((Pb,Zr)$TiO_3$). These dielectric films have dielectric constants of tens to hundreds times higher than conventional dielectric films made of conventional silicon nitride or silicon oxide film or composite film thereof have.

Among them, using BST as a dielectric film in dynamic random access memory (DRAM) or ferroelectric RAM (FRAM) has been continuously pursued. However, in the case of BST, when it is deposited as a thin film for a capacitor in high integrated semiconductor devices, there is a limitation in reducing the thickness of the film due to poor leakage current characteristics. This limits high integration of semi conductor devices using BST as a dielectric film of a capacitor.

Accordingly, regardless of the causes of poor leakage characteristics of BST dielectric film, methods of reducing the leakage current of a BST dielectric film capacitor are under study. For example, a method of forming buffer layers has been proposed by U.S. Pat. No. 5,471,364. In this case, the buffer layers are made of low dielectric constant materials formed between a BST dielectric film and an upper electrode or a lower electrode but that exhibit good leakage current characteristics. In addition, the buffer layers are thinner than the BST dielectric film. Furthermore, another method is proposed by U.S. Pat. No. 5,731,220 to reduce leakage currents. In this method, a small amount of erbium (Er) is added to a BST precursor solution with the molar ratio of the erbium to titanium in the BST precursor solution between 0.01–0.05 to deposit a BST film.

A method of interposing buffer layers, however, has a problem in that forming a dielectric film of a relatively low dielectric constant results in a reduction in the overall capacitance. Furthermore, a method of adding a small amount of Er has many problems in mass production because the process is complicated. Also, changes in capacitance characteristics resulting from changes in process variables are difficult to predict. Additionally, in U.S. Pat. No. 5,731,220, only the importance of reducing the leakage currents by addition of ER has been described, but the implementation of the invention has not been successful because the mechanism for such reduction is not clearly identified.

Accordingly, there is a need to improve the method of depositing a perovskite series dielectric film, e.g., a BST film, to avoid the problems described above, for example, reduction in overall capacitance, complicated process steps, and unpredictable changes in capacitor dielectric characteristics caused by changes in process conditions, particularly, during actual mass production.

SUMMARY OF THE INVENTION

To solve the above problems, the present invention provides a capacitor having a perovskite series dielectric film, in which the leakage current characteristics are improved.

In addition, the present invention provides a simplified method of manufacturing a perovskite series dielectric capacitor which improves the leakage current characteristics of the dielectric film.

Accordingly, the present invention reduces leakage currents by containing $Cu_xO$ or copper in a perovskite series dielectric film. That is, a capacitor according to the present invention includes a perovskite series dielectric film disposed between upper and lower electrodes made of conductive material, wherein the perovskite series dielectric film contains $Cu_xO$ or copper. The $Cu_xO$ or copper is preferably contained in the grain boundary of the perovskite series dielectric film.

More preferably, the perovskite series dielectric film is a barium strontium titanate (BST) film or a PZT film.

Also, the present invention provides a method of manufacturing a perovskite series dielectric film capacitor, including penetrating the perovskite series dielectric film with $Cu_xO$ or copper. According to a method of manufacturing a general perovskite series dielectric film capacitor, after depositing a conductive material on a substrate to form a lower electrode and depositing a perovskite series dielectric film on the lower electrode, a conductive material is deposited on the perovskite series dielectric film to form an upper electrode. The method of manufacturing the perovskite series dielectric film capacitor according to the invention has steps similar to the method of manufacturing the general perovskite series dielectric film capacitor, further including unique steps of depositing $Cu_xO$ (x=1 or 2) on the perovskite series dielectric film to form a $Cu_xO$ film, and performing a heat treatment on the substrate to permit $Cu_xO$ or copper of the $Cu_xO$ film to penetrate the perovskite series dielectric film.

In this case, the $Cu_xO$ film may be formed sufficiently thin that substantially all $Cu_xO$ or copper penetrates the perovskite series dielectric film to leave substantially no residue on the perovskite series dielectric film after the heat treatment. This is for preventing a reduction in the overall capacitance caused by $Cu_xO$ film having a relatively low dielectric constant compared to the perovskite series film. Furthermore, the heat treatment is performed before, after, or both before and after forming the upper electrode.

It is believed that the prevention of leakage current flowing through a grain boundary of a columnar crystal structure of the perovskite series dielectric film is made possible by permitting $Cu_xO$ or copper to penetrate the grain boundary of the perovskite series dielectric film.

BRIEF DESCRIPTION OF THE DRAWINGS

The above object and advantage of the present invention will become more apparent by describing in detail a preferred embodiment thereof with reference to the attached drawings in which.

DESCRIPTION OF THE PREFERRED EMBODIMENTS

This invention may be embodied in many different forms and should not be construed as being limited to the embodiments set forth herein. Furthermore, it will be understood that when a layer is referred to as being "on" another layer or substrate, it can be directly on the other layer or substrate, or intervening layers may also be present.

Figure 1:
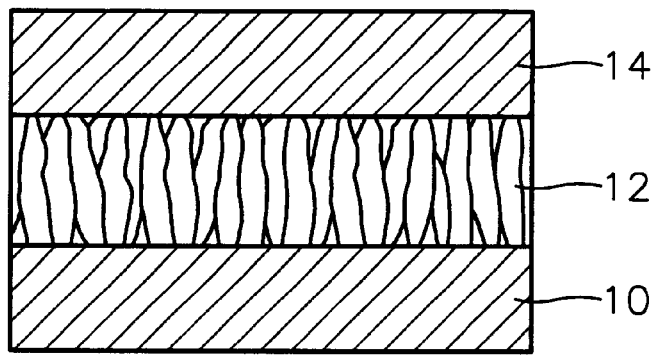
FIG. 1 is a sectional view of a conventional capacitor having a barium strontium titanate (BST) dielectric film.

In order to discover the cause for poor leakage current characteristics in a barium strontium titanate (BST) dielectric film, a capacitor having a BST dielectric film of the structure such as shown in FIG. 1 has been fabricated to study the crystal structure of the BST dielectric film, using an electron microscope. It can be seen in FIG. 1 that a BST dielectric film 12 disposed between upper and lower electrodes 10 and 14 has a columnar crystal structure. It is thought that electric charges move along the columnar grain boundary, thereby increasing leakage currents. In FIG. 1, using a sputtering technique, the BST dielectric film 12 is deposited to a thickness of 1,000 Å at a temperature of 400° C. If a thinner BST dielectric film is deposited by other methods such as chemical vapor deposition (CVD) and spin coating, then its structure after crystallization is similar to the structure shown in FIG. 1.

Therefore, it is thought that the leakage current characteristic can be improved if a certain material penetrates such a columnar crystal grain boundary to at least block partly the movement of electrical charges therethrough. In the confirmation of this, the leakage current characteristic was improved by forming $Cu_xO$ film (x=1 or 2) on a BST dielectric film and then permitting $Cu_xO$ or copper of the $Cu_xO$ film to penetrate the BST dielectric film.

Figure 2:
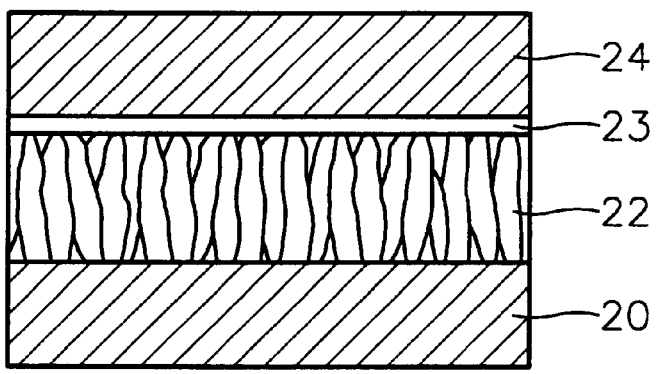
FIGS. 2 and 3 are sectional views showing a process of manufacturing a capacitor in which $Cu_xO$ or copper penetrates a BST dielectric film.
Figure 3:
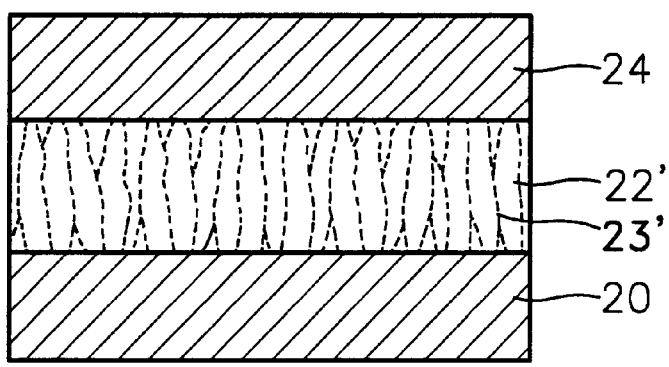

According to the preferred embodiments of the present invention shown in FIGS. 2 and 3, a conductive material is deposited on a substrate (not shown for the sake of clarity and simplicity) by a conventional method to form a lower electrode 20. The thickness of the lower electrode 20 is about 1,000 Å although it may change depending on the particular integration density of a semiconductor device. The conductive material of which the electrode is composed may be a monoatomic metal such as Pt, Ru, Ir, Rh, W, and Ta, metal nitride such as TiN, TaN and WN, metal oxide from the platinum family such as $RuO_2$ and $IrO_2$, metal oxidized nitride such as TiON and TaON, ternary nitride such as TaSiN, TaAlN, TiSiN and TiAlN, and polycrystal silicon, or composite layers thereof Subsequently, BST is deposited on the lower electrode 20 to form a BST dielectric film 22. The BST can be deposited via already known various techniques such as sputtering, spin coating or chemical vapor deposition (CVD). The thickness of the BST dielectric film 22 is about 200–1,000 Å although it may change depending on a particular integration density of a semiconductor device.

For the purpose of the present invention, other perovskite series dielectric films such as a PZT film can be used in place of the BST dielectric film. This is because the PZT film as well as the BST film has a columnar structure after crystallization. One skilled in the art will appreciate that an alternative material to the two disclosed materials may be used without departing from the sprit and scope of the present invention.

Next, $Cu_xO$ is deposited on the BST dielectric film 22 to form a $Cu_xO$ film 23 to penetrate into the BST dielectric film 22 by a subsequent thermal process. The $Cu_xO$ can be deposited by sputtering or metal-organic CVD (MOCVD). In particular, when it is deposited by sputtering, a target can be manufactured by compression-molding $Cu_xO$ powder using a press, or a $Cu_xO$ film can be deposited by sputtering using a Cu target in an oxygen atmosphere. The thickness of the $Cu_xO$ film 23 may vary depending on that of the underlying BST dielectric film 22, but preferably it is about 20–100 Å. This preferred thickness range allows substantially all $Cu_xO$ or copper to penetrate into the BST dielectric film in a subsequent thermal process, preferably, leaving no residue thereon.

Then, a conductive material is deposited on the $Cu_xO$ film 23 to form an upper electrode 24. A material from which the upper electrode 24 is formed can be above mentioned conductive materials or composite layers thereof like the material comprising the lower electrode 20. Of course, the upper electrode 24 may consist of the same material as that of the lower electrode 20. Like the lower electrode 20, the thickness of the upper electrode 24 is about 1,000 Å although it may change depending on a particular integration density of a semiconductor device.

Next, a thermal process for $Cu_xO$ or copper of the $Cu_xO$ film 23 penetrating into the BST dielectric film is performed. The heat treatment for the thermal process can be carried out at a temperature of approximately 200–600° C. in an air, nitrogen, oxygen, ozone or an inert gas atmosphere for approximately 5–30 minutes. As a result, as shown in FIG. 3, a BST dielectric film 22' penetrated or impregnated with $Cu_xO$ or copper is formed and the overlying $Cu_xO$ film (23 of FIG. 2) disappears. The $Cu_xO$ or copper is preferably contained in the grain boundary 23' of the BST dielectric film. Those of skill in the art will appreciate that, within the spirit and scope of the invention, a portion of the $Cu_xO$ film may remain if a temperature of the heat treatment is low, a process time is short, or the deposition of $Cu_xO$ is made thick, but it is preferable to leave no $Cu_xO$ film in order to prevent a reduction in an overall dielectric constant.

Alternatively, the heat treatment may be performed prior to forming the upper electrode 24. Furthermore, this process may be performed both before and after forming the upper electrode 24. A separate thermal process may not be necessary if the thermal budget in a subsequent process after forming the upper electrode 24 is sufficient to permit $Cu_xO$ or copper of the $Cu_xO$ film to penetrate the BST dielectric film.

In an example described below the leakage current characteristics and dielectric constants of a BST dielectric film capacitor formed in accordance with the present invention and the conventional BST dielectric film capacitor were compared. Three kinds of capacitors were prepared, all of which used a Pt film having a thickness of approximately 1,000 Å for upper and lower electrodes and all of which formed a BST dielectric film by sputtering to a thickness of approximately 500 Å at a temperature of approximately 400° C. As may be appreciated, the first and second capacitors are formed conventionally, while the third capacitor is formed in accordance with the invention. The detailed structure and heat treatment conditions of each capacitor are as follows:

(1) First capacitor

A capacitor having the structure of Pt/BST/Pt was formed without an intermediate heat treatment, and after formation of the capacitor, a heat treatment was carried out at a temperature of approximately 300° C. in an air atmosphere at an atmospheric pressure for approximately 30 minutes.

(2) Second capacitor

A BST dielectric film was formed on a Pt lower electrode, and then after a first heat treatment was carried out at a temperature of approximately 500° C., in an air atmosphere, at an atmospheric pressure, for approximately 10 minutes. Then, a Pt upper electrode was formed on the BST dielectric film. Subsequently, a second heat treatment was carried out at a temperature of approximately 300° C. in an air atmosphere at an atmospheric pressure for approximately 30 minutes.

(3) Third capacitor

A BST dielectric film was formed on a Pt lower electrode, and then after $Cu_xO$ film is deposited to a thickness of approximately 50 Å on the BST dielectric film by sputtering. Then, a first heat treatment was carried out at a temperature of approximately 500° C. in an air atmosphere at an atmospheric pressure for approximately 10 minutes. Subsequently, a Pt upper electrode was formed on the BST dielectric film, and a second heat treatment was carried out at a temperature of approximately 300° C. in an air atmosphere at an atmospheric pressure for approximately 30 minutes.

Figure 4:
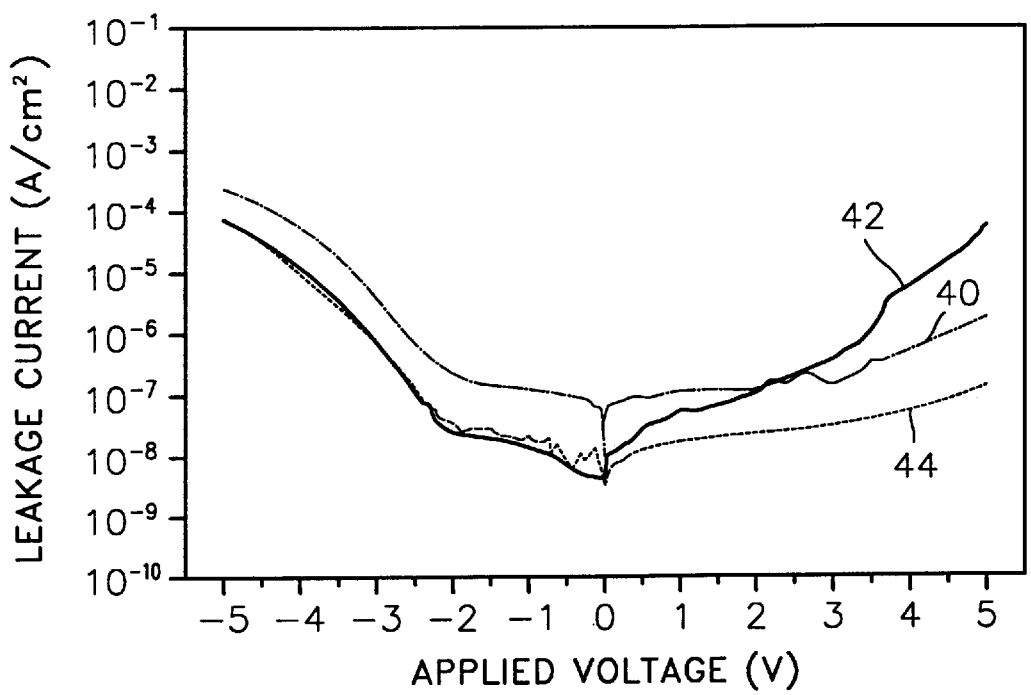
FIG. 4 is a graph comparing the leakage current characteristics of a conventional BST dielectric film capacitor and a BST dielectric film capacitor according to the present invention.

A graph of FIG. 4 illustrates the experimental results of measuring leakage current characteristics of the three above-described capacitors. Reference numerals 40, 42, and 44 in FIG. 4 indicate leakage current characteristics of the first, second, and third capacitors, respectively. It can be seen in FIG. 4 that the leakage current characteristic 44 of the third capacitor—in which a $Cu_xO$ film is formed on a BST dielectric film and $Cu_xO$ or copper then penetrates the BST dielectric film by a heat treatment—is improved about ten times when compared with the leakage current characteristics 40 and 42 of the first and second capacitors in which a $Cu_xO$ film is not formed.

Figure 5:
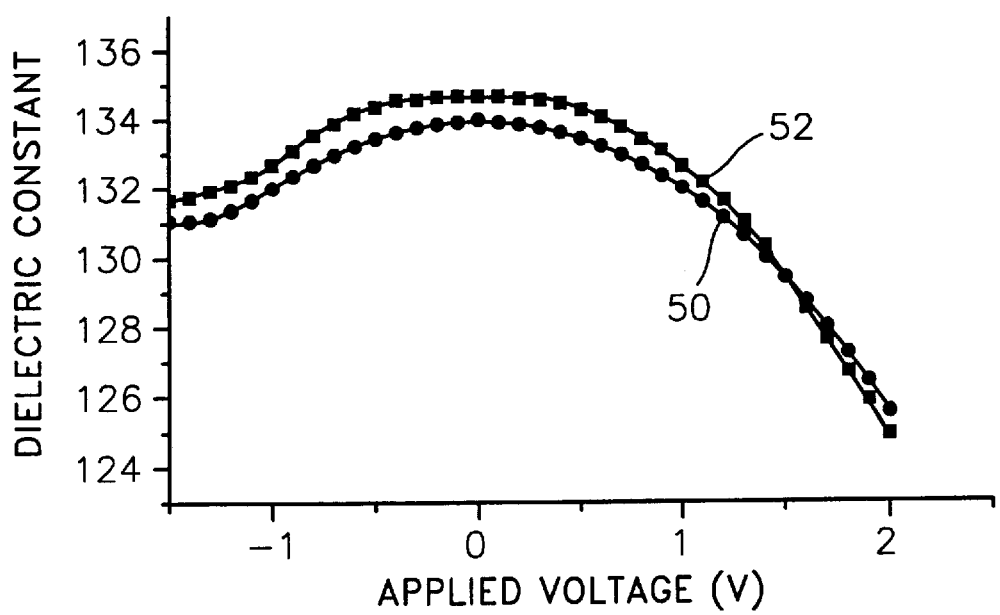
FIG. 5 is a graph comparing the dielectric constants of the conventional BST dielectric film capacitor and the BST dielectric film capacitor according to the present invention.

FIG. 5 illustrates a graph showing the results of measuring the dielectric constants of the second and third capacitors. Reference numerals 50 and 52 in FIG. 5 indicate the dielectric constants of the BST dielectric films of the second and third capacitors, respectively. It can be seen in FIG. 5 that the dielectric constant 52 of the capacitor according to the present invention in which a $Cu_xO$ film was formed on the BST dielectic film and in which $Cu_xO$ or copper then penetrated the BST dielectric film differs little from the dielectric constant 50 of the conventional capacitor without $Cu_xO$ or copper penetration into the BST film. In particular, the dielectric constants of both capacitors are almost the same at a typical operational voltage in a DRAM (about 1.2 V). This means that substantially all $Cu_xO$ or copper of the $Cu_xO$ film penetrates into the BST dielectric film by the heat treatment to leave substantially no residue of the $Cu_xO$ film having a relatively low dielectric constant.

The BST dielectric film capacitor according to the present invention can be widely used in semiconductor devices such as DRAM or FRAM. In particular, the BST dielectric film capacitor can be manufactured in various types such as cylinder shape or stack shape although the present invention is described with a simple planar capacitor electrode configuration.

As described in the foregoing, the present invention provides a capacitor having a BST dielectric film containing copper or impregnated with copper by permitting $Cu_xO$ or copper to penetrate the grain boundary of the BST dielectric film having a columnar crystal structure by the heat treatment. The $Cu_xO$ or copper is preferably contained in grain boundary of the perovskite series dielectric film. Therefore, a simple process in accordance with the present invention can reduce a leakage current flowing through the grain boundary of the BST dielectric film. Furthermore, a reduction in a dielectric constant can be prevented by penetrating substantially all $Cu_xO$ or copper of a $Cu_xO$ film formed on the BST dielectric film into the BST dielectric film by a heat treatment to leave substantially no residue thereof. In addition, since there is no particular change in a leakage current characteristic and dielectric constant after $Cu_xO$ or copper penetrates into the BST dielectric film by the heat treatment, the BST dielectric film capacitor according to the invention can be mass-produced with good reproducibility.

While this invention has been particularly shown and described with reference to preferred embodiments thereof, it will be understood by those skilled in the art that various modifications in form and details may be made therein without departing from the spirit and scope of the invention as defined by the appended claims.

What is claimed is:

1. A method of manufacturing a capacitor comprising:

depositing a conductive material on a substrate to form a lower electrode;

depositing a perovskite series dielectric film on the lower electrode;

depositing $Cu_xO$ on the perovskite series dielectric film to form a $Cu_xO$ film;

driving $Cu_xO$ or copper into the perovskite series dielectric film; and depositing a conductive material on the perovskite series dielectric film to form an upper electrode, wherein the $Cu_xO$ film is formed to a thickness such that substantially all $Cu_xO$ or copper penetrates into the perovskite series dielectric film after the driving.

2. The method of claim 1, wherein the perovskite series dielectric film is a barium strontium titanate (BST) film or a PZT film.

3. The method of claim 1, wherein the $Cu_xO$ is deposited by sputtering or chemical vapor deposition.

4. The method of claim 1, wherein the perovskite series dielectric is deposited by sputtering, chemical vapor deposition, or spin coating.

5. The method of claim 1, wherein the conductive material forming the lower and upper electrodes is selected from the group consisting of W, Ta, Pt, Ru, Ir, Rh, TiN, TaN, WN, $RUO_2$, $IrO_2$, TiON, TaON, TaSiN, TaAlN, TiSiN, TiAlN, polycrystal silicon, and composite layers thereof.

6. The method of claim 1, wherein said driving is performed by heat treating.

7. The method of claim 6, wherein said heat treating is performed at a temperature of 200–600° C. in an air, nitrogen, oxygen, ozone, or inert gas atmosphere for about 5–30 minutes.

8. The method of claim 7, wherein said heat treating is performed before the upper electrode is formed.

9. The method of claim 7, wherein said heat treating is performed after the upper electrode is formed.

10. The method of claim 7, wherein said heat treating is performed before and after the upper electrode is formed.

* * * * *